US008822048B2

(12) United States Patent
Ebe et al.

(10) Patent No.: US 8,822,048 B2
(45) Date of Patent: Sep. 2, 2014

(54) PASTE COMPOSITION AND PRINTED CIRCUIT BOARD

(75) Inventors: Hirofumi Ebe, Ibaraki (JP); Shinichi Inoue, Ibaraki (JP); Yoshihiro Furukawa, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 18 days.

(21) Appl. No.: 13/356,955

(22) Filed: Jan. 24, 2012

(65) Prior Publication Data

US 2012/0186865 A1    Jul. 26, 2012

(30) Foreign Application Priority Data

Jan. 26, 2011 (JP) ................. 2011-014129

(51) Int. Cl.
*H01M 2/02* (2006.01)
*H01M 14/00* (2006.01)
*H05K 5/03* (2006.01)
*B32B 33/00* (2006.01)

(52) U.S. Cl.
USPC ............... 429/7; 174/257; 174/258; 428/688; 428/704

(58) Field of Classification Search
USPC ............ 524/91, 403, 424; 428/457, 688, 704; 429/7; 174/257, 258
See application file for complete search history.

(56) References Cited

U.S. PATENT DOCUMENTS

| | | | |
|---|---|---|---|
| 4,921,623 A | 5/1990 | Yamaguchi et al. | |
| 6,344,157 B1 | 2/2002 | Cheng et al. | |
| 2002/0153513 A1 | 10/2002 | Kurihara et al. | |
| 2004/0131907 A1 | 7/2004 | Arita et al. | |
| 2004/0178393 A1 | 9/2004 | Kurihara et al. | |
| 2005/0056687 A1 | 3/2005 | Matsumoto et al. | |
| 2006/0019090 A1 | 1/2006 | Wessling | |
| 2007/0275159 A1 | 11/2007 | Wessling | |
| 2010/0044088 A1 | 2/2010 | Watanabe et al. | |
| 2010/0193573 A1 | 8/2010 | Wessling | |
| 2010/0193961 A1 | 8/2010 | Konishi et al. | |

FOREIGN PATENT DOCUMENTS

| | | |
|---|---|---|
| EP | 0300453 A2 | 1/1989 |
| EP | 2042580 A1 | 4/2009 |
| JP | S61-292632 A | 12/1986 |
| JP | H09-307215 A | 11/1997 |
| JP | 11-092740 A | 4/1999 |
| JP | 2000-273317 A | 10/2000 |
| JP | 2002-133945 A | 5/2002 |
| JP | 2002-245851 A | 8/2002 |
| JP | 2004200064 A | 7/2004 |
| JP | 2005-089685 A | 4/2005 |
| JP | 2005-132860 A | 5/2005 |
| JP | 2006-044233 A | 2/2006 |
| JP | 2009123441 A | 6/2009 |

OTHER PUBLICATIONS

EP Search Report issued Mar. 21, 2012 in EP Application No. 11194134.0.
U.S. Appl. No. 13/312,353 by Inoue et al, filed Dec. 6, 2011.
Office Action issued Mar. 18, 2014 in JP Application No. 2011-014129.
Office Action issued Jul. 8, 2014 in counterpart Japanese patent application 2011-014129 and English translation thereof.

*Primary Examiner* — Kriellion Sanders
(74) *Attorney, Agent, or Firm* — Panitch Schwarze Belisario & Nadel LLP (57) ABSTRACT

A conductor layer is formed on one surface of a base insulating layer. The conductor layer includes a collector portion, and a drawn-out conductor portion extending in an elongated shape from the collector portion. A cover layer is formed on the base insulating layer to cover a predetermined portion of the conductor layer. A material for the cover layer includes a paste composition containing a compound expressed by the formula (1).

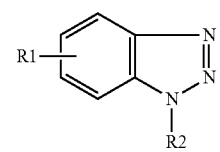

(1)

15 Claims, 6 Drawing Sheets

PASTE COMPOSITION AND PRINTED CIRCUIT BOARD

BACKGROUND OF THE INVENTION (1) Field of the Invention

The present invention relates to a paste composition and a printed circuit board using the same.

(2) Description of Related Art

In recent years, clean energies, which hardly cause harmful substances to be generated in use, have been paid attention to, and cells using the clean energies, e.g., fuel cells and solar cells have been developed. Particularly, small-sized and high-capacity cells are required for mobile devices such as mobile phones. Therefore, fuel cells capable of obtaining higher energy densities than those in conventional cells such as lithium secondary cells have been paid attention to. The fuel cells include direct methanol fuel cells.

In the direct methanol fuel cell, methanol is decomposed with a catalyst, to form hydrogen ions. The hydrogen ions and oxygen in air are reacted with each other, to generate electric power. In this case, chemical energy can be significantly efficiently converted into electric energy so that a very high energy density can be obtained.

A flexible printed circuit board (hereinafter abbreviated as an FPC board) is provided as a collection circuit inside the direct methanol fuel cell (see, e.g., JP 2004-200064 A).

The FPC board has a configuration in which a conductor layer is formed on a base insulating layer having flexibility. A part of the FPC board is pulled out of a fuel cell. Various external circuits are connected to a portion, which has been pulled out of the fuel cell, of the FPC board.

When methanol supplied as fuel to the direct methanol fuel cell reacts with oxygen, formic acid having a strong corrosive action is produced. The formic acid causes a conductor layer in the FPC board to corrode.

BRIEF SUMMARY OF THE INVENTION

The present invention is directed to a paste composition capable of inhibiting a conductive layer from corroding by formic acid and a printed circuit board using the same.

(1) According to an aspect of the present invention, a paste composition contains a resin material, and a compound expressed by the following formula (1), where R1 and R2 in the following formula (1) are the same as or different from each other, and are each a hydrogen atom or a substituent group.

(1)

The paste composition contains a compound expressed by the foregoing formula (1). When the paste composition is used as a material for the cover layer that covers the conductor layer, the conductor layer is inhibited from corroding by the formic acid even with the formic acid contacting the cover layer.

(2) The substituent group may include an alkyl group, a phenyl group, an amino group, a mercapto group, an aromatic-containing functional group, an alkoxy group, an alkylamino group, an alkoxycarbonyl group, or a carboxyl group. When the paste composition is used as the material for the cover layer that covers the conductor layer, the conductor layer is more sufficiently inhibited from corroding by the formic acid.

(3) The R1 may be a hydrogen atom, a carboxyl group, or a methyl group. When the paste composition is used as a material for the cover layer that covers the conductor layer, the conductor layer is sufficiently inhibited from corroding by the formic acid.

(4) The R2 may be a hydrogen atom. When the paste composition is used as the material for the cover layer that covers the conductor layer, the conductor layer is more sufficiently inhibited from corroding by the formic acid.

(5) The paste composition may further contain a conductive material. In this case, conductivity of the paste composition is ensured. When the paste composition is used as the material for the cover layer that covers the conductor layer, conduction can occur between the conductor layer and another element via the cover layer while the conductor layer is inhibited from corroding by the formic acid.

(6) The conductive material may contain at least one of carbon black, graphite, a carbon nanotube, a carbon fiber, gold, and silver.

In this case, the carbon black, graphite, carbon nanotube, carbon fiber, gold, and silver are relatively low in cost, and are low in electrical resistance. Therefore, the production cost can be reduced, and the conductivity of the paste composition can be sufficiently ensured.

(7) The ratio of the compound may be not less than 0.1 parts by weight and not more than 10 parts by weight to 100 parts by weight of the whole of the compound, the resin material, and the conductive material.

When the paste composition is used as the material for the cover layer that covers the conductor layer, conductivity between the conductor layer and another element by the cover layer is sufficiently ensured while the conductor layer is sufficiently inhibited from corroding by the formic acid.

(8) The resin material may contain at least one of thermosetting resin and ultraviolet curing resin. When the paste composition is used as the material for the cover layer that covers the conductor layer, the conductor layer is more sufficiently inhibited from corroding by the formic acid.

(9) According to another aspect of the present invention, a printed circuit board includes an insulating layer, a conductor layer provided on the insulating layer and having a predetermined pattern, and a cover layer formed to cover at least a part of the conductor layer, in which the cover layer contains the paste composition according to the one aspect of the present invention.

In the printed circuit board, the conductor layer having the predetermined pattern is formed on the insulating layer, and the cover layer is formed to cover at least a part of the conductor layer. In this case, the cover layer contains the paste composition according to the one aspect of the present invention. Therefore, the conductor layer is inhibited from corroding by formic acid even if the formic acid contacts the cover layer.

Other features, elements, characteristics, and advantages of the present invention will become more apparent from the following description of preferred embodiments of the present invention with reference to the attached drawings.

BRIEF DESCRIPTION OF THE SEVERAL VIEWS OF THE DRAWING

FIGS. 1 (a) and 1 (b) illustrate a configuration of a flexible printed circuit board according to the present embodiment;

FIGS. 2 (a) to 2 (d) are sectional views for illustrating steps of a method for manufacturing the flexible printed circuit board;

FIGS. 3 (a) to 3 (c) are sectional views for illustrating steps of a method for manufacturing the flexible printed circuit board;

FIGS. 4 (a) and 4 (b) illustrate a configuration of a fuel cell using the flexible printed circuit board illustrated in FIG. 1;

FIGS. 5 (a) to 5 (c) are sectional views illustrating steps of a method for manufacturing samples in inventive examples and comparative examples.

DESCRIPTION OF THE PREFERRED EMBODIMENTS

A paste composition and a printed circuit board according to an embodiment of the present invention will be described below with reference to the drawings. In the present embodiment, a flexible printed circuit board used for a fuel cell will be described as an example of the printed circuit board.

(1) Configuration of Flexible Printed Circuit Board

Figure 1:
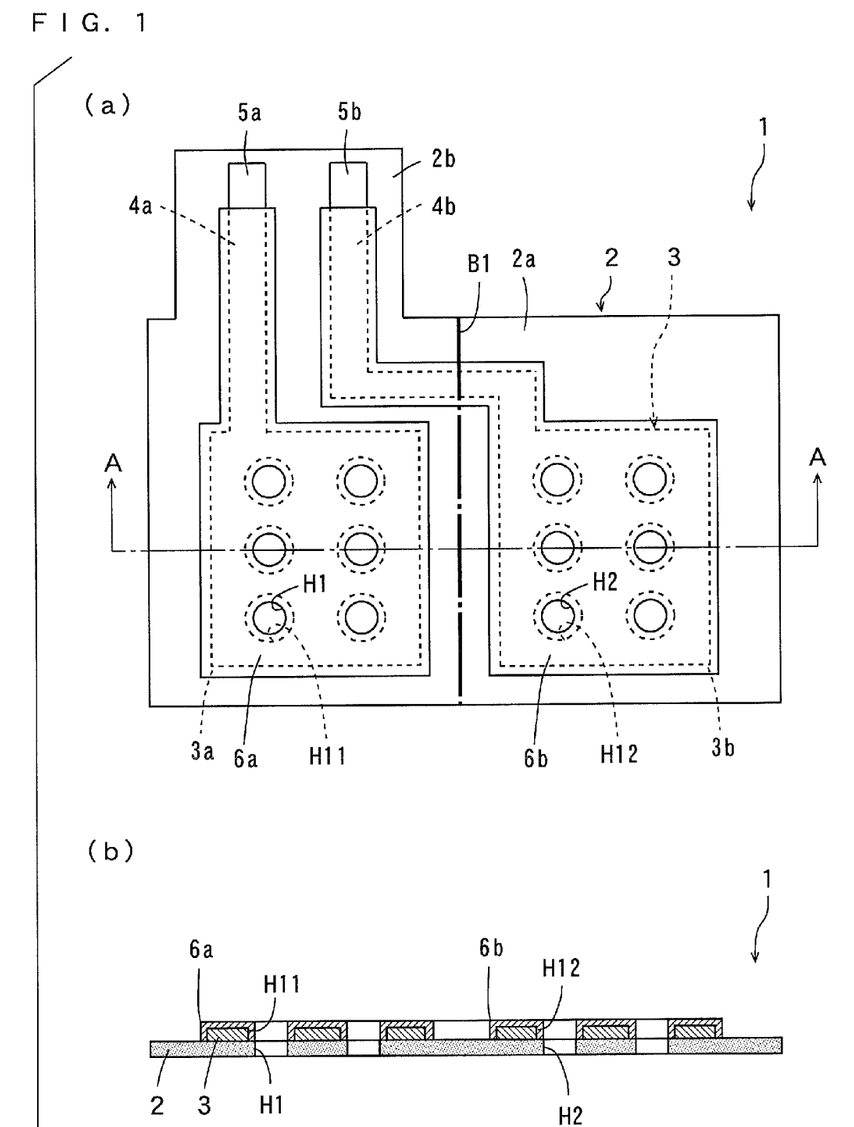

FIG. 1 (a) is a plan view of a flexible printed circuit board according to the present embodiment, and FIG. 1 (b) is a sectional view taken along a line A-A of the flexible printed circuit board illustrated in FIG. 1 (a). In the following description, a flexible printed circuit board is abbreviated as an FPC board.

As illustrated in FIGS. 1 (a) and 1 (b), an FPC board 1 includes a base insulating layer 2. The base insulating layer 2 includes a rectangular first insulating portion 2a and a second insulating portion 2b extending outward from one side of the first insulating portion 2a. The one side of the first insulating portion 2a and another side parallel thereto are referred to as lateral sides, and another pair of sides perpendicular to the lateral sides of the first insulating portion 2a are referred to as end sides.

A bend portion B1 is provided parallel to the end sides and to divide the first insulating portion 2a into two substantially equal parts in the first insulating portion 2a in the base insulating layer 2. The first insulating portion 2a is bent along the bend portion B1, as will be described later. The bend portion B1 may be a shallow groove with a line shape or a mark with a line shape, for example. Alternatively, there may be nothing at the bend portion B1 if the first insulating portion 2a can be bent at the bend portion B1. The second insulating portion 2b extends outward from the lateral sides of one of regions of the first insulating portion 2a with the bend portion B1 as its boundary.

A plurality of (six in this example) openings H1 are formed in one of the regions of the first insulating portion 2a with the bend portion B1 as its boundary. A plurality of (six in this example) openings H2 are formed in the other region of the first insulating portion 2a with the bend portion B1 as its boundary.

A conductor layer 3 is formed on one surface of the base insulating layer 2. The conductor layer 3 includes a pair of rectangular collector portions 3a and 3b, and drawn-out conductor portions 4a and 4b extending in an elongated shape from the collector portions 3a and 3b.

Each of the collector portions 3a and 3b has a pair of lateral sides parallel to the lateral sides of the first insulating portion 2a and a pair of end sides parallel to the end sides of the first insulating portion 2a. The collector portion 3a and the collector portion 3b are respectively formed in one of regions and the other region of the first insulating portion 2a with the bend portion B1 as its boundary.

An opening H11 having a larger diameter than that of the opening H1 of the base insulating layer 2 is formed in a portion, above the opening H1, of the collector portion 3a. An opening H12 having a larger diameter than that of the opening H2 of the base insulating layer 2 is formed in a portion, above the opening H2, of the collector portion 3b.

The drawn-out conductor portion 4a linearly extends from the lateral side of the collector portion 3a onto a region on the second insulating portion 2b. The drawn-out conductor portion 4b linearly extends in a bent shape from the lateral side of the collector portion 3b onto a region on the second insulating portion 2b.

Cover layers 6a and 6b are formed on the base insulating layer 2 to cover a predetermined portion of the conductor layer 3. The cover layer 6a is formed on the base insulating layer 2 to cover the collector portion 3a and to cover a portion of the drawn-out conductor portion 4a excluding the tip thereof, and the cover layer 6b is formed on the base insulating layer 2 to cover the collector portion 3b and to cover a portion of the drawn-out conductor portion 4b excluding the tip thereof. The tips of the drawn-out conductor portions 4a and 4b, which are exposed without being covered with the cover layers 6a and 6b, are referred to as drawn-out electrodes 5a and 5b. The cover layer 6a contacts an upper surface of the base insulating layer 2 within the openings H11 of the collector portion 3a. The cover layer 6b contacts the upper surface of the base insulating layer 2 within the openings H12 of the collector portion 3b.

The cover layers 6a and 6b are composed of a paste composition. The paste composition contains a resin material and a conductive material. The resin material includes thermosetting resin such as phenol resin, epoxy resin, acrylic resin, polyurethane resin, polyimide resin, or polyester resin, or ultraviolet curing resin such as epoxy resin, polyester resin, polyimide resin, or acrylic resin. One of the resin materials may be used alone, or a plurality of types of resin materials may be used by mixture. Particularly, thermosetting polymer is preferably used, and at least one of phenol-based resin, epoxy-based resin, and polyester-based resin is more preferably used. The conductive material includes an inorganic material such as gold, silver, a nano-silver particle, carbon black, graphite, a carbon nanotube, or a carbon fiber, or a conductive polymer such as polythiophene or polyaniline. One of the conductive materials may be used alone, or the plurality of types of conductive materials may be used by mixture.

The paste composition contains a benzotriazole compound (hereinafter referred to as an additive compound) expressed by the following formula (1):

(1)

In the formula (1), R1 and R2 are the same as or different from each other, and are each a hydrogen atom or a substituent group. The substituent group includes an alkyl group ($C_nH_{2n+1}$; n=1 to 12), a phenyl group, an amino group, a mercapto group, an aromatic-containing functional group, an alkoxy group, an alkylamino group, an alkoxy carbonyl group, or a carboxyl group. R1 may be coupled to any position of a benzene ring.

The additive compound includes 1H-benzotriazole, methylbenzotriazole, or carboxybenzotriazole, or its sodium salt, its potassium salt, or its derivative. Particularly, 1H-benzotriazole, 5-methylbenzotriazole, or carboxybenzotriazole is preferably used.

The ratio of the additive compound in the paste composition is adjusted so that the cover layers 6a and 6b are prevented from corroding by formic acid. More specifically, the ratio of the additive compound is preferably not less than 0.1 parts by weight and not more than 10 parts by weight, and more preferably not less than 0.5 parts by weight and not more than 10 parts by weight to 100 parts by weight of the whole of the resin material, the conductive material, and the additive compound.

(2) Method for Manufacturing FPC Board

A method for manufacturing the FPC board 1 illustrated in FIG. 1 will be described below.

Figure 2:
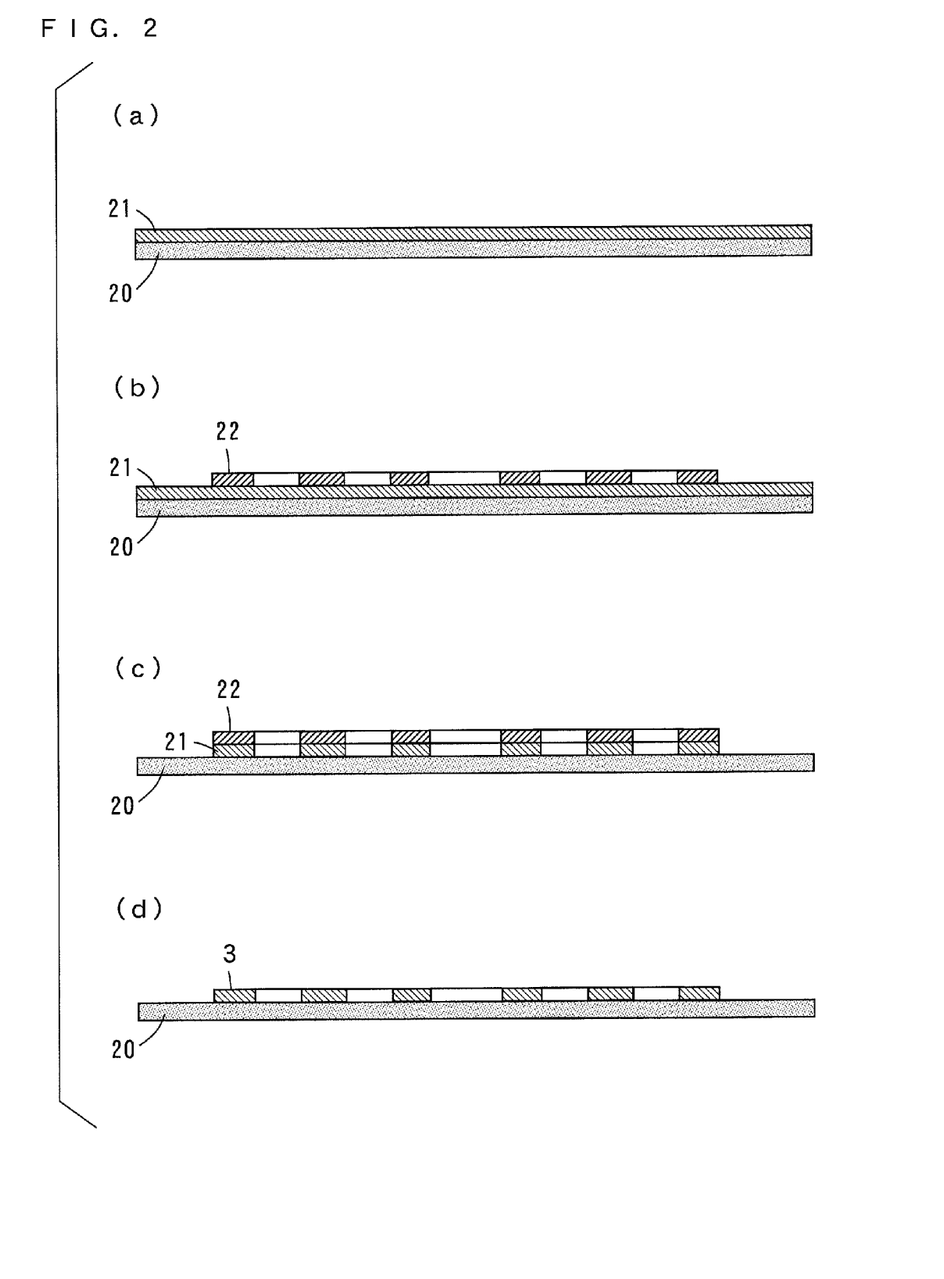
Figure 3:
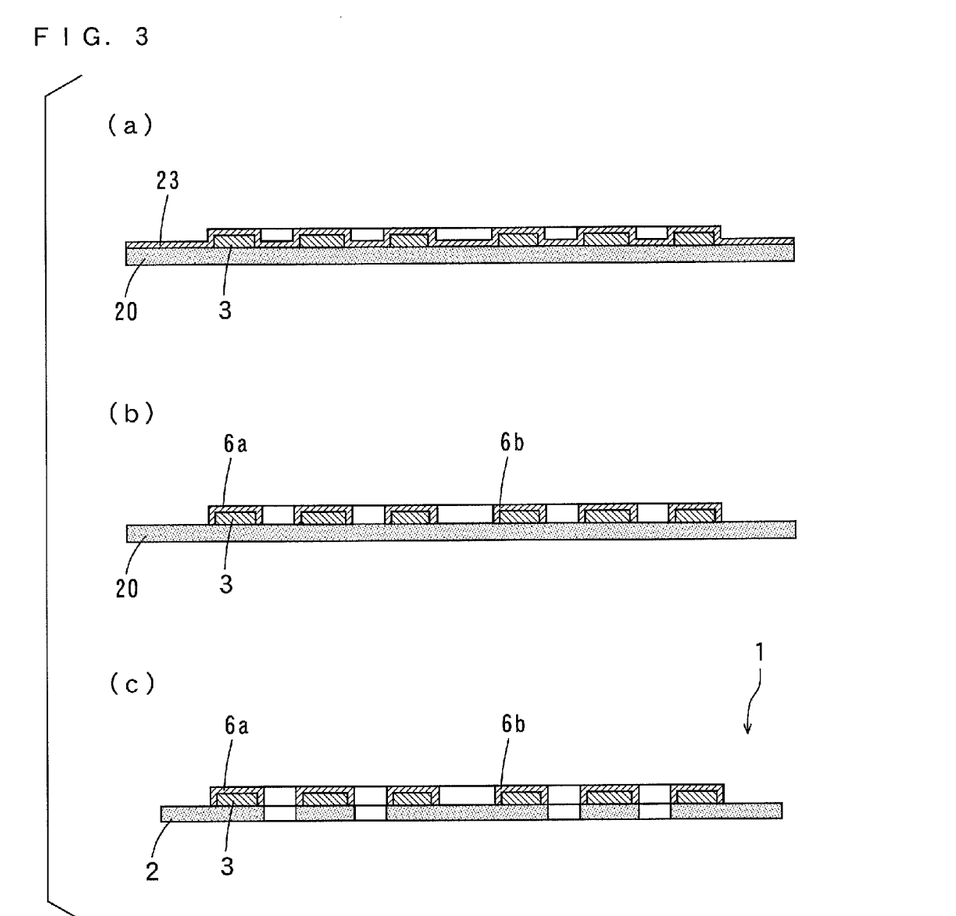

FIGS. 2 and 3 are sectional views for illustrating steps of a method for manufacturing the FPC board 1.

As illustrated in FIG. 2 (a), an insulating layer 20 made of polyimide, for example, and a conductor layer 21 made of copper, for example, are laminated, to form a two-layer base. The thickness of the insulating layer 20 is preferably not less than 1 μm and not more than 100 μm. When the thickness of the insulating layer 20 is 1 μm or more, the FPC board 1 becomes easy to handle. When the thickness of the insulating layer 20 is 100 μm or less, flexibility of the FPC board 1 is ensured, and the FPC board 1 is not prevented from being miniaturized. The thickness of the insulating layer 20 is preferably not less than 5 μm and not more than 50 μm, and more preferably not less than 5 μm and not more than 30 μm. The thickness of the conductor layer 21 is not less than 3 μm and not more than 100 μm, and more preferably not less than 5 μm and not more than 50 μm.

As illustrated in FIG. 2 (b), an etching resist 22 having a predetermined pattern is then formed on the conductor layer 21. The etching resist 22 is formed by forming a resist layer on the conductor layer 21 with a dry film resist or the like, exposing the resist layer in a predetermined pattern, and developing the resist layer, for example.

As illustrated in FIG. 2 (c), a region, excluding a region under the etching resist 22, of the conductor layer 21 is then removed by etching using ferric chloride, for example. As illustrated in FIG. 2 (d), the etching resist 22 is then removed by a stripping solution. Thus, a conductor layer 3 is formed on the insulating layer 20.

As illustrated in FIG. 3 (a), the paste composition containing the conductive material, the resin material, and the additive compound is then applied on the conductor layer 3 and the insulating layer 20, to form a cover layer 23. The thickness of the cover layer 23 is not less than 5 μm and not more than 100 μm, and more preferably not less than 10 μm and not more than 20 μm.

As illustrated in FIG. 3 (b), the cover layer 23 is exposed in a predetermined pattern, and is then developed, to form cover layers 6a and 6b. As illustrated in FIG. 3 (c), the insulating layer 20 is cut to a predetermined shape, to complete the FPC board 1 including the base insulating layer 2, the conductor layer 3, and the cover layers 6a and 6b.

While the conductor layer 3 is formed on the insulating layer 20 by lamination and etching in the example illustrated in FIGS. 2 and 3, the conductor layer 3 may be formed on the insulating layer 20 using another method such as sputtering, evaporation, or plating. While the conductor layer 3 is formed by a subtractive method in the example illustrated in FIGS. 2 and 3, the conductor layer 3 may be formed by another method such as a semi-additive method. While the cover layers 6a and 6b are formed using an exposure method in the example illustrated in FIGS. 2 and 3, the cover layers 6a and 6b may be formed using another method. For example, cover layers 6a and 6b in a predetermined pattern may be formed using a printing technique, and the cover layers 6a and 6b may be then subjected to thermosetting processing.

As a material for the base insulating layer 2, polyimide may be replaced with polyamide-imide, polyethylene terephthalate, polyethylene naphthalate, polyphenylene sulfide, liquid crystal polymer, or polyolefin. As a material for the conductor layer 3, copper may be replaced with another metal such as silver or gold, or an alloy containing a plurality of types of metals.

(3) Fuel Cell using FPC Board

Figure 4:
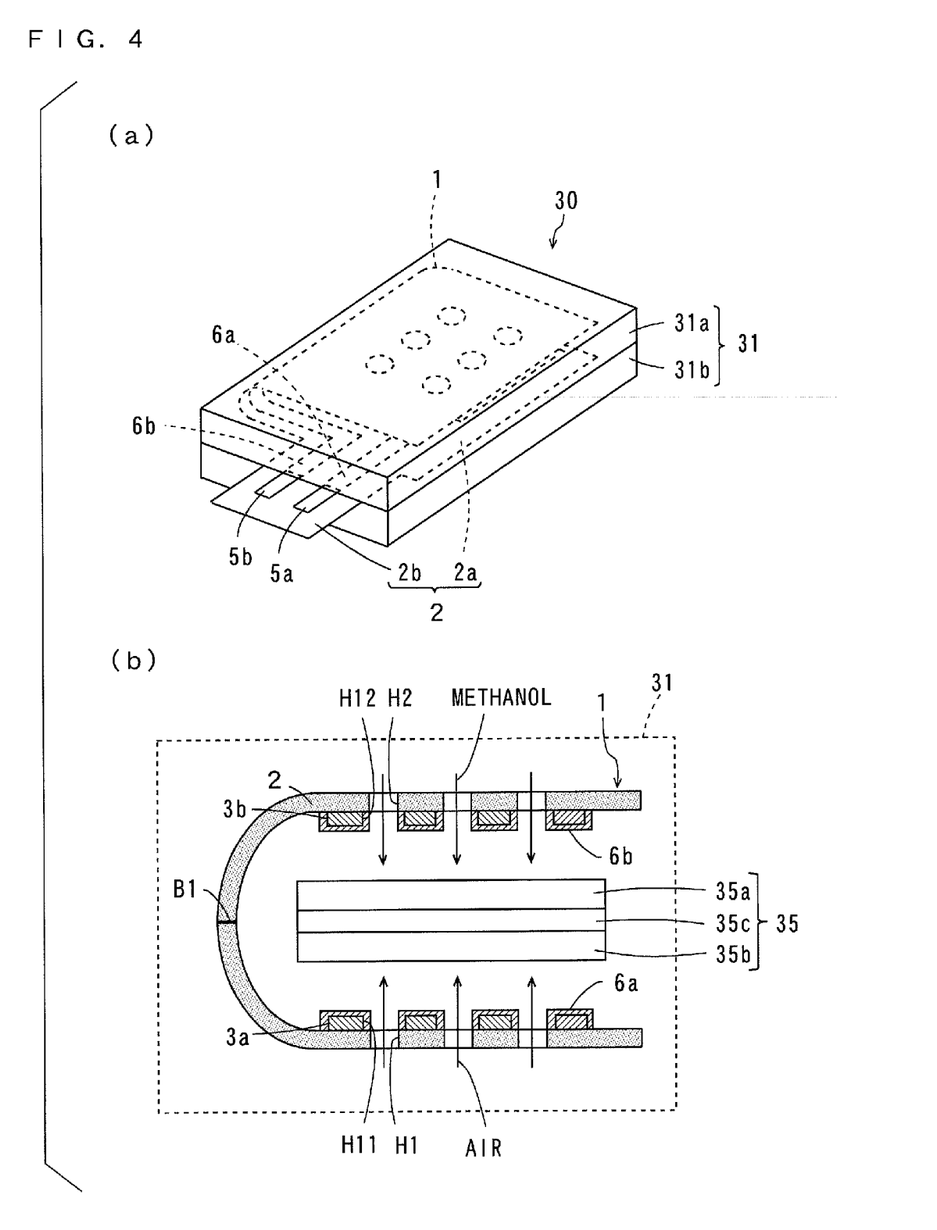

A fuel cell using the above-mentioned FPC board 1 will be described below. FIG. 4 (a) is an external perspective view of the fuel cell using the FPC board 1, and FIG. 4 (b) illustrates functions in the fuel cell.

As illustrated in FIG. 4 (a), a fuel cell 30 has a casing 31 in a rectangular parallelepiped shape including half members 31a and 31b. The FPC board 1 is sandwiched between the half members 31a and 31b while being bent along the bend portion B1 illustrated in FIG. 1 with its one surface, on which the conductor layer 3 (FIG. 1) and cover layers 6a and 6b are formed, directed inward.

A second insulating portion 2b in a first base insulating layer 2 in the FPC board 1 is pulled out of a clearance between the half members 31a and 31b. Thus, drawn-out electrodes 5a and 5b on the second insulating portion 2b are exposed to the outside of the casing 31. Terminals of various external circuits are electrically connected to the drawn-out electrodes 5a and 5b.

As illustrated in FIG. 4 (b), an electrode film 35 is arranged between the collector portion 3a and the collector portion 3b in the bent FPC board 1 within the casing 31. The electrode film 35 includes a fuel electrode 35a, an air electrode 35b, and an electrolyte film 35c. The fuel electrode 35a is formed on one surface of the electrolyte film 35c, and the air electrode 35b is formed on the other surface of the electrolyte film 35c. The fuel electrode 35a in the electrode film 35 opposes the collector portion 3b in the FPC board 1, and the air electrode 35b opposes the collector portion 3a in the FPC board 1.

While the electrode film 35 and the FPC board 1 are spaced apart from each other in FIG. 4 (b), the fuel electrode 35a and the air electrode 35b in the electrode film 35 actually contact the cover layer 6b and the cover layer 6a in the FPC board 1, respectively. In this case, the cover layers 6a and 6b contain a conductive material so that conductivity between the collector portion 3b and the fuel electrode 35a and conductivity between the collector portion 3a and the air electrode 35b are ensured.

Fuel is supplied to the fuel electrode 35a in the electrode film 35 via the openings H2 and H12 of the FPC board 1. In the present embodiment, methanol is used as the fuel. Air is supplied to the air electrode 35b in the electrode film 35 via the openings H1 and H11 of the FPC board 1.

In this case, in the fuel electrode 35a, methanol is decomposed into hydrogen ions and carbon dioxide, to produce electrons. The produced electrons are guided from the collector portion 3b to the drawn-out electrode 5b (FIG. 4 (a)) in the FPC board 1. The hydrogen ions obtained by decomposing methanol permeate through the electrolyte film 35c, to reach the air electrode 35b. In the air electrode 35b, the hydrogen ions and oxygen react with each other while electrons, which have been guided from the drawn-out electrode 5a (FIG. 4 (a)) to the collector portion 3a, are consumed, to form water. In such a manner, electric power is supplied to an external circuit connected to the drawn-out electrodes 5a and 5b.

(4) Effect of Present Embodiment

In the fuel cell 30, when methanol used as fuel reacts with oxygen, formic acid having a strong corrosive action is produced. When the formic acid contacts the conductor layer 3 in the FPC board 1, the conductor layer 3 corrodes. In the FPC board 1 according to the present embodiment, the cover layers 6a and 6b are formed to cover the conductor layer 3. Therefore, the formic acid and the conductor layer 3 are prevented from contacting each other.

However, the formic acid enters an area between the conductor layer 3 and the cover layers 6a and 6b so that the formic acid and the conductor layer 3 may contact each other, and the conductor layer 3 may corrode. In the FPC board 1 according to the present embodiment, the cover layers 6a and 6b are formed using the paste composition containing the additive compound expressed by the foregoing formula (1) so that the conductor layer 3 is inhibited from corroding by the formic acid. The reason may be that the additive compound moves toward a surface of the conductor layer 3 in the cover layers 6a and 6b, a layer that covers the surface of the conductor layer 3 is formed of the additive compound that has moved, and the layer prevents the formic acid from entering the conductor layer 3.

(5) Inventive Examples and Comparative Example

Figure 5:
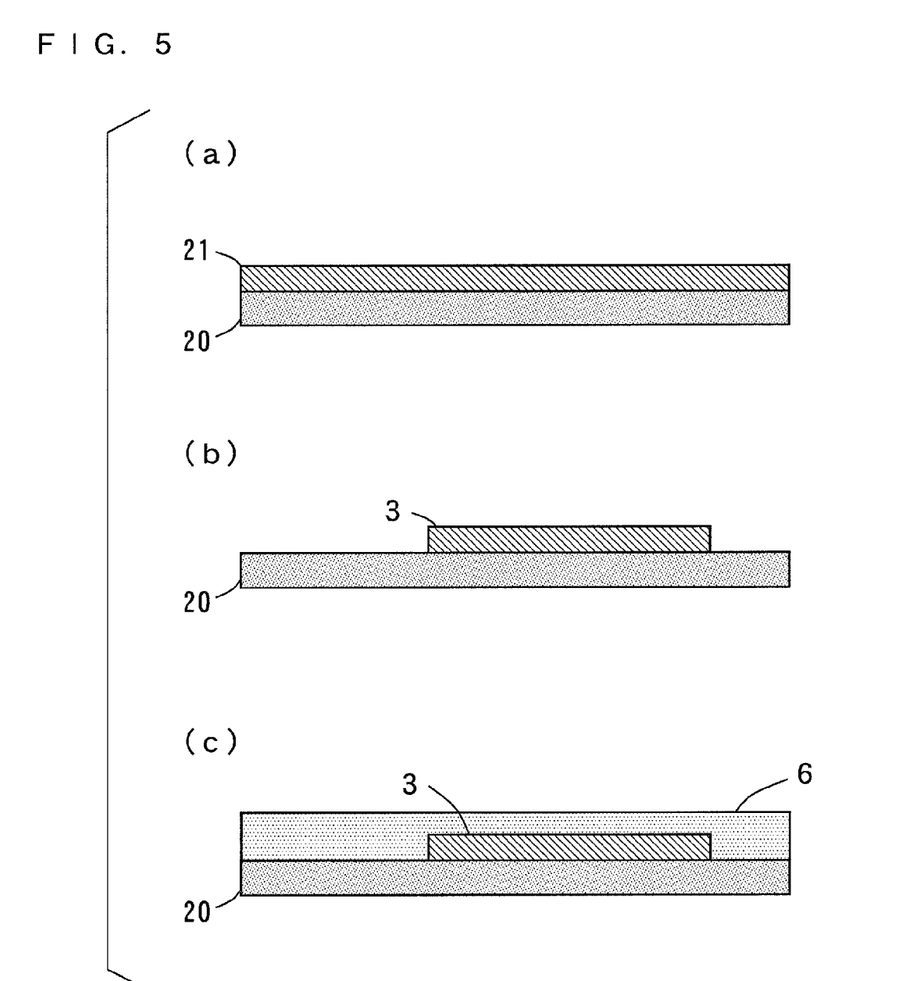

Samples serving as inventive examples 1 to 15 and a comparative example were prepared in the following manner. FIG. 5 is a sectional view and a plan view illustrating steps of a method for manufacturing the samples in the inventive examples 1 to 15 and the comparative example.

(5-1) Inventive Example 1

75 parts by weight of dimethyl terephthalate, 40 parts by weight of dimethyl isophthalate, 80 parts by weight of ethylene glycol, 60 parts by weight of neopentyl glycol, and 0.1 parts by weight of tetrabutyl titanate were prepared in a four-necked flask including a Vigreux fractionating column, and ester exchange reaction was promoted at a temperature of 180° C. for three hours. 2 parts by weight of trimellitic anhydride and 80 parts by weight of sebacic acid were then added thereto, and dehydration reaction was promoted for one hour. The four-necked flask was then gradually depressurized to 1 mm Hg or less, and polymerization reaction was promoted at a temperature of 270° C. for two hours, to obtain polyester resin.

40 parts by weight of polyester resin and 100 parts by weight of diethylene glycol monoethyl ether acetate were then prepared in the four-necked flask, were dissolved at a temperature of 80° C., and were cooled to a normal temperature. Then, 5 parts by weight of a block member of hexamethylene diisocyanate (DURANATE manufactured by ASAHI KASEI CHEMICALS CORPORATION) was prepared in the four-necked flask, to obtain binder resin (a resin material). 10 parts by weight of conductive carbon black (KetjenBlack EC-DJ600 manufactured by Lion Corporation), 45 parts by weight of graphite (manufactured by Nippon Graphite Industries, Ltd.), and 45 parts by weight of the binder resin were then mixed, and their mixture was then dispersed using a triple roll kneader, to obtain a solution containing a resin material and a conductive material. 1.5 parts by weight of 1H-benzotriazole was added to the solution, to obtain a paste composition.

On the other hand, as illustrated in FIG. 5 (a), a two-layer base in which an insulating layer 20 made of polyimide and a conductor layer 21 made of copper were laminated was prepared. As illustrated in FIG. 5 (b), the conductor layer 21 was then etched using ferric chloride, to form a conductor layer 3 having a predetermined pattern. As illustrated in FIG. 5 (c), the paste composition was then applied on the insulating layer 20 to cover the conductor layer 3, and was dried and cured at a temperature of 150° C. for 30 minutes, to form the cover layer 6. Thus, the sample in the inventive example 1 was obtained. The shape of the sample was a rectangle having dimensions of 4 cm×8 cm. The thickness of the insulating layer 20 was 25 μm, the thickness of the conductor layer 3 was 18 μm, and the thickness of the cover layer 6 was 20 μm.

(5-2) Inventive Example 2

The sample in the inventive example 2 was prepared in a similar manner to that in the inventive example 1 except that an additive amount of 1H-benzotriazole was changed from 1.5 parts by weight to 5 parts by weight.

(5-3) Inventive Example 3

The sample in the inventive example 3 was prepared in a similar manner to that in the inventive example 1 except that an additive amount of 1H-benzotriazole was changed from 1.5 parts by weight to 10 parts by weight.

(5-4) Inventive Example 4

The sample in the inventive example 4 was prepared in a similar manner to that in the inventive example 1 except that 1H-benzotriazole was replaced with 5-methylbenzotriazole, and its additive amount was set to 0.5 parts by weight.

(5-5) Inventive Example 5

The sample in the inventive example 5 was prepared in a similar manner to that in the inventive example 4 except that an additive amount of 5-methylbenzotriazole was changed from 0.5 parts by weight to 2 parts by weight.

(5-6) Inventive Example 6

The sample in the inventive example 6 was prepared in a similar manner to that in the inventive example 4 except that an additive amount of 5-methylbenzotriazole was changed from 0.5 parts by weight to 6 parts by weight.

(5-7) Inventive Example 7

The sample in the inventive example 7 was prepared in a similar manner to that in the inventive example 1 except that 1H-benzotriazole was replaced with carboxybenzotriazole, and its additive amount was set to 1 part by weight.

(5-8) Inventive Example 8

The sample in the inventive example 8 was prepared in a similar manner to that in the inventive example 7 except that an additive amount of carboxybenzotriazole was changed from 1 part by weight to 3 parts by weight.

(5-9) Inventive Example 9

The sample in the inventive example 9 was prepared in a similar manner to that in the inventive example 7 except that an additive amount of carboxybenzotriazole was changed from 1 part by weight to 5.5 parts by weight.

(5-10) Inventive Example 10

The sample in the inventive example 10 was prepared in a similar manner to that in the inventive example 1 except that an additive amount of 1H-benzotriazole was changed from 1.5 parts by weight to 0.05 parts by weight.

(5-11) Inventive Example 11

The sample in the inventive example 11 was prepared in a similar manner to that in the inventive example 4 except that an additive amount of 5-methylbenzotriazole was changed from 0.5 parts by weight to 0.05 parts by weight.

(5-12) Inventive Example 12

The sample in the inventive example 12 was prepared in a similar manner to that in the inventive example 7 except that an additive amount of carboxybenzotriazole was changed from 1 part by weight to 0.05 parts by weight.

(5-13) Inventive Example 13

The sample in the inventive example 13 was prepared in a similar manner to that in the inventive example 1 except that an additive amount of 1H-benzotriazole was changed from 1.5 parts by weight to 11 parts by weight.

(5-14) Inventive Example 14

The sample in the inventive example 14 was prepared in a similar manner to that in the inventive example 4 except that an additive amount of 5-methylbenzotriazole was changed from 0.5 parts by weight to 10.5 parts by weight.

(5-15) Inventive Example 15

The sample in the inventive example 15 was prepared in a similar manner to that in the inventive example 7 except that an additive amount of carboxybenzotriazole was changed from 1 part by weight to 12 parts by weight.

(5-16) Comparative Example

The sample in the comparative example was prepared in a similar manner to that in the inventive example 1 except that a paste composition was prepared without adding 1H-benzotriazole.

(5-17) Evaluation

The samples in the inventive examples 1 to 15 and the comparative example were immersed in a solution containing formic acid at a density of 1000 ppm under an environment of 50° C. for seven days, to observe a corrosive state of the conductor layer 3.

Figure 6:
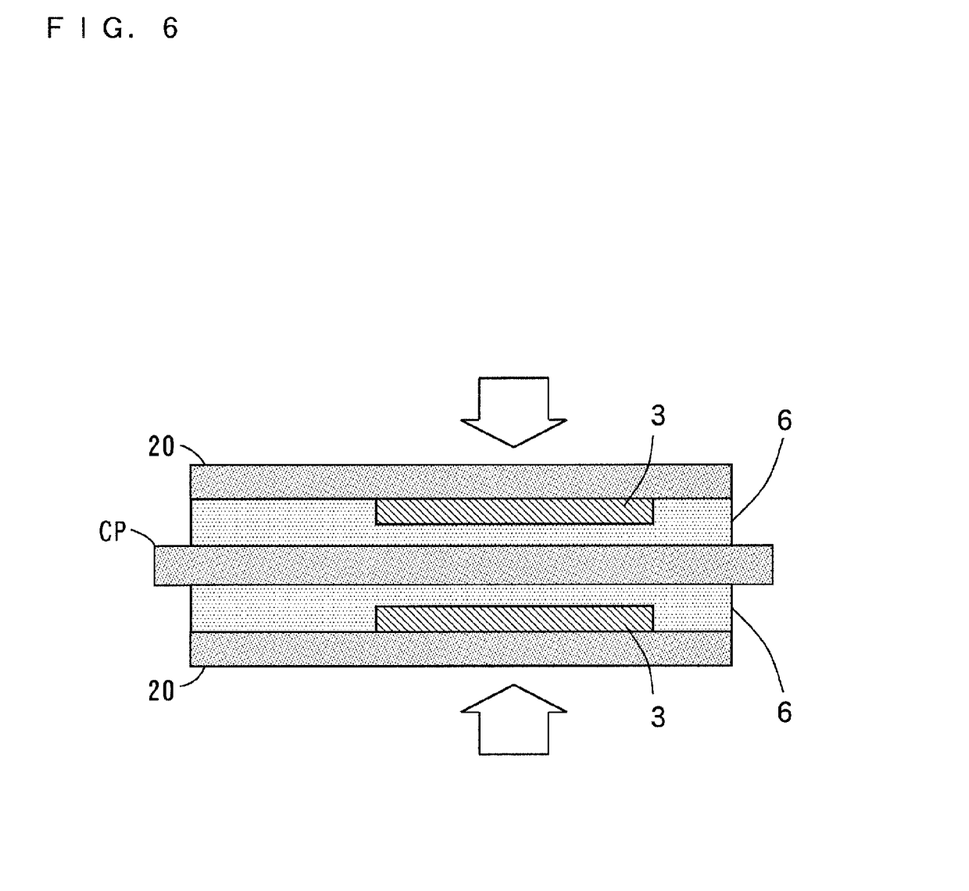
FIG. 6 is a schematic view illustrating a method for measuring a contact resistance.

Contact resistances of the samples in the inventive examples 1 to 15 and the comparative example were measured in the following manner before and after the immersion of the samples in a formic acid solution. FIG. 6 is a schematic view illustrating a method for measuring the contact resistances.

As illustrated in FIG. 6, a pair of samples in each of the inventive examples 1 to 15 and the comparative example was prepared. Cover layers 6 in the pair of samples were overlaid on each other with carbon paper CP sandwiched therebetween, followed by pressurization at 3 Mpa. In the state, a resistance value between the conductor layers 3 in the pair of samples was measured.

Table 1 illustrates compositions of the paste compositions used in the inventive examples 1 to 15 and the comparative example. Table 2 illustrates evaluation results of corrosive conditions and contact resistance values in the inventive examples 1 to 15 and the comparative example.

TABLE 1

|  | RESIN MATERIAL | CONDUCTIVE MATERIAL | | COMPOUND | | |
|---|---|---|---|---|---|---|
|  |  | CARBON BLACK | GRAPHITE | 1H-BENZO-TRIAZOLE | 5-METHYL BENZO-TRIAZOLE | CARBOXY BENZO-TRIAZOLE |
| INVENTIVE EXAMPLE 1 | 45 | 10 | 45 | 1.5 |  |  |
| INVENTIVE EXAMPLE 2 | 45 | 10 | 45 | 5.0 |  |  |
| INVENTIVE EXAMPLE 3 | 45 | 10 | 45 | 10.0 |  |  |
| INVENTIVE EXAMPLE 4 | 45 | 10 | 45 |  | 0.5 |  |
| INVENTIVE EXAMPLE 5 | 45 | 10 | 45 |  | 2.0 |  |
| INVENTIVE EXAMPLE 6 | 45 | 10 | 45 |  | 6.0 |  |
| INVENTIVE EXAMPLE 7 | 45 | 10 | 45 |  |  | 1.0 |
| INVENTIVE EXAMPLE 8 | 45 | 10 | 45 |  |  | 3.0 |

TABLE 1-continued

| | | CONDUCTIVE MATERIAL | | COMPOUND | | |
| | RESIN MATERIAL | CARBON BLACK | GRAPHITE | 1H-BENZO-TRIAZOLE | 5-METHYL BENZO-TRIAZOLE | CARBOXY BENZO-TRIAZOLE |
|---|---|---|---|---|---|---|
| INVENTIVE EXAMPLE 9 | 45 | 10 | 45 | | | 5.5 |
| INVENTIVE EXAMPLE 10 | 45 | 10 | 45 | 0.05 | | |
| INVENTIVE EXAMPLE 11 | 45 | 10 | 45 | | 0.05 | |
| INVENTIVE EXAMPLE 12 | 45 | 10 | 45 | | | 0.05 |
| INVENTIVE EXAMPLE 13 | 45 | 10 | 45 | 11.0 | | |
| INVENTIVE EXAMPLE 14 | 45 | 10 | 45 | | 10.5 | |
| INVENTIVE EXAMPLE 15 | 45 | 10 | 45 | | | 12.0 |
| COMPARATIVE EXAMPLE | 45 | 10 | 45 | | | |

TABLE 2

| | | CONTACT RESISTANCE VALUE [mΩ] | |
| | CORROSIVE CONDITION | BEFORE IMMERSION | AFTER IMMERSION |
|---|---|---|---|
| INVENTIVE EXAMPLE 1 | ○ | 18 | 19 |
| INVENTIVE EXAMPLE 2 | ○ | 18 | 19 |
| INVENTIVE EXAMPLE 3 | ○ | 17 | 18 |
| INVENTIVE EXAMPLE 4 | ○ | 19 | 21 |
| INVENTIVE EXAMPLE 5 | ○ | 17 | 17 |
| INVENTIVE EXAMPLE 6 | ○ | 16 | 18 |
| INVENTIVE EXAMPLE 7 | ○ | 19 | 19 |
| INVENTIVE EXAMPLE 8 | ○ | 20 | 21 |
| INVENTIVE EXAMPLE 9 | ○ | 18 | 20 |
| INVENTIVE EXAMPLE 10 | Δ | 17 | 180 |
| INVENTIVE EXAMPLE 11 | Δ | 18 | 210 |
| INVENTIVE EXAMPLE 12 | Δ | 19 | 140 |
| INVENTIVE EXAMPLE 13 | Δ | 19 | 38 |
| INVENTIVE EXAMPLE 14 | Δ | 20 | 41 |
| INVENTIVE EXAMPLE 15 | Δ | 20 | 48 |
| COMPARATIVE EXAMPLE | x | 19 | 7400 |

As a result, in the samples in the inventive examples 1 to 9, the conductor layer 3 hardly corroded. In the samples in the inventive examples 10 to 15, the conductor layer 3 slightly corroded. On the other hand, in the sample in the comparative example, the conductor layer 3 corroded in its substantially entire area.

In the samples in the inventive examples 1 to 9, the contact resistances before and after the immersion in the formic acid solution hardly changed. In the samples in the inventive examples 10 to 12, the contact resistance after the immersion in the formic acid solution was approximately 7 to 12 times the contact resistance before the immersion in the formic acid solution. In the samples in the inventive examples 13 to 15, the contact resistance after the immersion in the formic acid solution was approximately 2 to 2.5 times the contact resistance before the immersion in the formic acid solution. In the sample in the comparative example, the contact resistance after the immersion in the formic acid solution was approximately 390 times the contact resistance before the immersion in the formic acid solution.

This proved that the cover layers 6a and 6b were formed using the paste composition containing the additive compound expressed by the foregoing formula (1) so that the conductor layer 3 was inhibited from corroding. This further provided that the ratio of the additive compound in the paste composition was not less than 0.5 parts by weight and not more than 10 parts by weight to 100 parts by weight of the whole of the resin material, the conductive material, and the additive compound so that the conductor layer 3 was sufficiently inhibited from corroding.

(6) Another Embodiment

While the whole of the cover layers 6a and 6b contains a conductive material in the above-mentioned embodiment, only portions of the cover layers 6a and 6b may contain a conductive material if conductivity between a collector portion 3b and a fuel electrode 35a and conductivity between a collector portion 3a and an air electrode 35b can be ensured. For example, portions, on the collector portions 3a and 3b, of the cover layers 6a and 6b may contain a conductive material, and portions, on drawn-out conductor portions 4a and 4b, of the cover layers 6a and 6b need not contain a conductive material.

If conductivity between the collector portion 3b and the fuel electrode 35a and conductivity between the collector portion 3a and the air electrode 35b can be ensured, and the conductor layer 3 can be prevented from corroding by formic acid, the cover layers 6a and 6b need not contain a conductive material. If the cover layers 6a and 6b are provided so that portions of the collector portions 3a and 3b are exposed, and a material having a high corrosion resistance, e.g., gold is used in the exposed portions of the collector portions 3a and 3b, for example, the cover layers 6a and 6b need not contain a conductive material. In this case, the conductor layer 3 can be prevented from corroding by the formic acid while inhibiting a high-cost material such as gold from being used.

While the paste composition containing the additive compound expressed by the foregoing formula (1) is used as the material for the cover layers 6a and 6b in the FPC board 1 used for the fuel cell 30 in the above-mentioned embodiment, the paste composition containing the additive compound expressed by the foregoing formula (1) may be used for another application.

In a solar cell (particularly, a dye-sensitized solar cell) or a lithium-ion cell, for example, the paste composition containing the additive compound expressed by the foregoing formula (1) can be used to protect a conductor layer used for collection from a chemical liquid or an electrolytic solution.

While preferred embodiments of the present invention have been described above, it is to be understood that variations and modifications will be apparent to those skilled in the art without departing the scope and spirit of the present invention. The scope of the present invention, therefore, is to be determined solely by the following claims.

We claim:

1. A printed circuit board comprising:
   an insulating layer;
   a conductor layer provided on said insulating layer and having pattern an electrode to which an external circuit is to be connected; and
   a cover layer provided on the conductor layer, wherein the cover layer is formed to cover a portion of said conductor layer excluding only the electrode, such that the electrode is the portion of the conductor layer not covered by the cover layer,
   wherein said cover layer comprises a paste composition comprising:
   a resin material;
   an electrically conductive material; and
   a compound of formula (1):

(1)

wherein R1 and R2 are the same or different from each other, and are each a hydrogen atom, an alkyl group, a phenyl group, an amino group, a mercapto group, an alkoxy group, an alkylamino group, an alkoxycarbonyl group, or a carboxyl group.

2. The printed circuit board according to claim 1, wherein R1 is a hydrogen atom, a carboxyl group, or a methyl group.

3. The printed circuit board according to claim 1, wherein R2 is a hydrogen atom.

4. The printed circuit board according to claim 1, wherein the electrically conductive material contains at least one selected from the group consisting of carbon black, graphite, a carbon nanotube, a carbon fiber, gold and silver.

5. The printed circuit board according to claim 1, wherein the ratio of the compound of formula (1) is not less than 0.1 parts by weight and not more than 10 parts by weight to 100 parts by weight of the total of the compound of formula (1), the resin material, and the electrically conductive material.

6. The printed circuit board according to claim 1, wherein the resin material contains at least one of a thermosetting resin and an ultraviolet curing resin.

7. The printed circuit board according to claim 1, wherein a thickness of the conductor layer is 3 μm to 100 μm.

8. The printed circuit board according to claim 1, wherein a thickness of the cover layer is 5 μm to 100 μm.

9. A printed circuit board comprising:
   an insulating layer;
   a conductor layer provided on said insulating layer and having an electrode to which an external circuit is to be connected; and
   a cover layer provided on the conductor layer, wherein the cover layer is formed to cover a portion of said conductor layer excluding only the electrode, such that the electrode is the only portion of the conductor layer not covered by the cover layer,
   wherein said cover layer comprises a paste composition comprising:
   a resin material;
   an electrically conductive material containing at least one selected from the group consisting of carbon black, graphite, a carbon nanotube and a carbon fiber; and
   a compound of formula (1):

(1)

wherein R1 and R2 are the same or different from each other, and are each a hydrogen atom, an alkyl group, a phenyl group, an amino group, a mercapto group, an alkoxy group, an alkylamino group, an alkoxycarbonyl group, or a carboxyl group.

10. The printed circuit board according to claim 9, wherein R1 is a hydrogen atom, a carboxyl group, or a methyl group.

11. The printed circuit board according to claim 9, wherein R2 is a hydrogen atom.

12. The printed circuit board according to claim 9, wherein the ratio of the compound of formula (1) is not less than 0.1 parts by weight and not more than 10 parts by weight to 100 parts by weight of the total of the compound of formula (1), the resin material, and the electrically conductive material.

13. The printed circuit board according to claim 9, wherein the resin material contains at least one of a thermosetting resin and an ultraviolet curing resin.

14. The printed circuit board according to claim 9, wherein a thickness of the conductor layer is 3 μm to 100 μM.

15. The printed circuit board according to claim 9, wherein a thickness of the cover layer is 5 μm to 100 μm.

* * * * *